United States Patent
Horine et al.

(10) Patent No.: US 7,249,955 B2
(45) Date of Patent: Jul. 31, 2007

(54) CONNECTION OF PACKAGE, BOARD, AND FLEX CABLE

(75) Inventors: Bryce D. Horine, Aloha, OR (US); Gary A. Brist, Yamhill, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/027,128

(22) Filed: Dec. 30, 2004

(65) Prior Publication Data

US 2006/0148281 A1   Jul. 6, 2006

(51) Int. Cl.
    *H01R 12/00* (2006.01)
(52) U.S. Cl. ....................................... 439/67
(58) Field of Classification Search ............... 439/67, 439/66, 76.1, 493, 492; 437/8, 228; 257/659; 174/261; 29/843
    See application file for complete search history.

(56) References Cited

U.S. PATENT DOCUMENTS

| | | | | |
|---|---|---|---|---|
| 5,316,204 A * | 5/1994 | Takehashi et al. | ........ | 228/179.1 |
| 5,478,008 A * | 12/1995 | Takahashi | .................. | 228/214 |
| 5,548,488 A * | 8/1996 | Hansen | ........................ | 361/815 |
| 5,723,347 A * | 3/1998 | Hirano et al. | ............... | 29/25.01 |
| 5,970,608 A * | 10/1999 | Tighe et al. | ................... | 29/843 |
| 6,736,740 B2 * | 5/2004 | Zheng | ......................... | 473/471 |
| 6,830,460 B1 * | 12/2004 | Rathburn | ...................... | 439/66 |
| 6,837,740 B2 * | 1/2005 | Kunishi et al. | .............. | 439/495 |
| 6,884,108 B2 * | 4/2005 | Saito et al. | .................. | 439/495 |
| 6,914,324 B2 * | 7/2005 | Rapport et al. | ............. | 257/686 |

* cited by examiner

*Primary Examiner*—Alexander Gilman
(74) *Attorney, Agent, or Firm*—Robert D. Anderson

(57) ABSTRACT

In some embodiments an apparatus includes a board, a package coupled to the board, and a flex cable coupled to the package and extending between the board and the package. Other embodiments are described and claimed.

24 Claims, 2 Drawing Sheets

CONNECTION OF PACKAGE, BOARD, AND FLEX CABLE

TECHNICAL FIELD

The inventions generally relate to connection between a package, a board and a flex cable.

BACKGROUND

It has been recognized by the present inventors that flex cables may be used for higher performance package to package or package to board interconnections. A connection to the flex cable is required in order to make the use of flex cables a success. Flex cables have previously been connected to motherboards and to the top of a package. However, these have not enhanced package to package or package to board interconnections.

A first option a direct solder connection from the flex cable to the package or the board. This provides good electrical performance but requires additional assembly processes and is a non-separable connection. A second option is using thin flex connectors. Thin flex connectors do not appear to match performance requirements of the flex cable, and tend to add significant cost to the package. A third option is to use a board level attach of a "flex patch". A "flex patch" minimizes cost, but requires an additional assembly process to attach the "patch" to the base board.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to connection between a package, a board, and a flex cable.

In some embodiments an apparatus includes a board, a package coupled to the board, and a flex cable coupled to the package and extending between the board and the package.

In some embodiments an apparatus includes a board, a first package coupled to the board, a second package coupled to the board, and a flex cable coupled to the first package and the second package and extending between the board and the first and second packages to provide high speed communication between the first package and the second package.

In some embodiments a flex cable is placed between a board (for example, a motherboard) and a package so that some of the package solder balls can be attached to the flex, some of the package solder balls can go through the flex and attach to the board, or some may only go through the flex to mechanically anchor the flex to the board.

Figure 1:
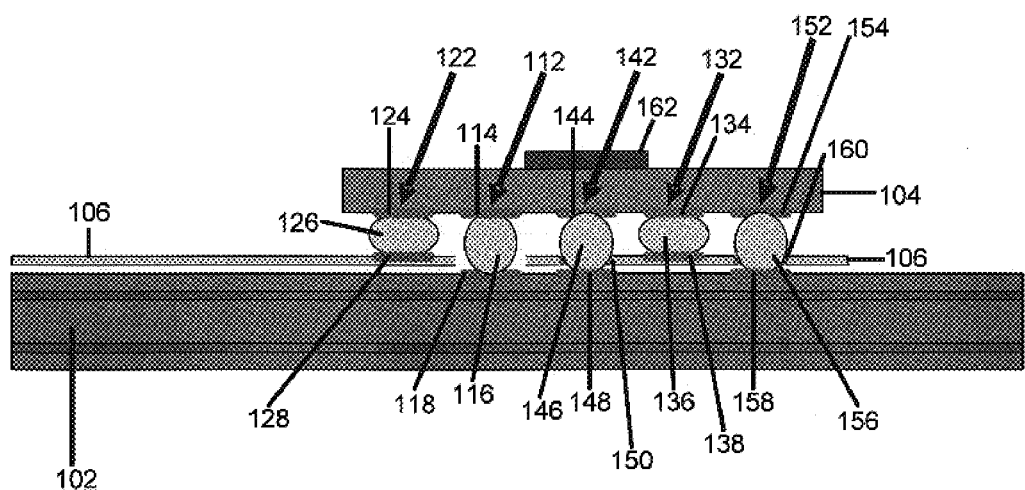
FIG. 1 illustrates a connection between a package, a board, and a flex cable according to some embodiments of the inventions.

FIG. 1 illustrates a board 102, a package 104, and a flex cable 106 according to some embodiments. In some embodiments board 102 is a printed circuit board (PCB). In some embodiments board 102 is a motherboard (MB). In some embodiments package 104 is a package of an Integrated Circuit (IC). In some embodiments package 104 is a package of a processor. In some embodiments package 104 is a BGA (Ball Grid Array) type package.

In some embodiments a package to board connection 112 couples the package 104 to the board 102. In some embodiments package to board connection 112 includes a package land pad 114, a solder ball 116, and a board land pad 118.

In some embodiments a package to flex cable connection 122 couples flex cable 106 to package 104. In some embodiments package to flex cable connection 122 includes a package land pad 124, a solder ball 126, and a flex cable land pad 128.

In some embodiments a second package to flex cable connection 132 couples flex cable 106 to package 104. In some embodiments the second package to flex cable connection 132 includes a package land pad 134, a solder ball 136, and a flex cable land pad 138.

In some embodiments a package to flex cable and board connection 142 couples the package 104, the flex cable 106, and the board 102. In some embodiments the package to flex cable and board connection 142 includes a package land pad 144, a solder ball 146, a board land pad 148, and a flex plated through hole 150 in the flex cable 106.

In some embodiments a second package to flex cable and board connection 152 couples the package 104, the flex cable 106, and the board 102. In some embodiments the second package to flex cable and board connection 152 includes a package land pad 154, a solder ball 156, a board land pad 158, and a flex plated through hole 160 in the flex cable 106.

In some embodiments of FIG. 1 a die 162 is on the package 104. In some embodiments (not illustrated in FIG. 1) a heat sink and/or a heat spreader are provided on package 104 to displace heat from the package 104. In some embodiments any thermal dissipation techniques may be used to dissipate heat from package 104.

In some embodiments a flex cable is incorporated into a computer system (for example a personal computer system or PC system) to improve system bus performance using existing standard assembly process flow. Some embodiments include connections between the package and the flex cable, connections between the package and the board, and/or connections between the package, the flex cable and the board. In some embodiments surface pads, non-plated through holes, and/or plated through holes in the flex cable are implemented to support various connection paths between a package, a board, and/or a flex cable. Such flexibility is beneficial because in order effectively to use a flex cable in a system high speed signals need to be passed directly from the package to the flex without any additional pads or vias. Additionally, ground signals (GND) must be passed to both the flex cable and the board, and some control signals may need to be passed directly from the package to the board.

In some embodiments signals may be passed directly to the board through a non-plated through hole in the flex cable. This connection can be made using a solder ball on the package (or socket) that passes through the non-plated through hole in the flex cable. Power and ground signals (and/or other common signals needed on both the flex cable and the board) can be attached to both the flex cable and the board using a plated through hole on the flex cable and a land pattern on the board. Electrical connection can be made to both the flex cable and the board by the solder ball on the package (or socket).

In some embodiments signals can be attached to only the flex cable in two different ways (or in one of two different ways). First, a surface pad may be placed on top of the flex cable and a solder ball is attached to the surface pad. The second option (not illustrated in FIG. 1) is to use a plated through hole in the flex cable (for example, for power and/or ground pins) but not attached a board pad to a trace. In some embodiments this second option may yield a more uniform solder ball height.

In some embodiments all of the benefits of a "flex patch" are obtained without any additional assembly steps being required. In some embodiments a flexibility of connections to the flex cable and/or the board are possible all in one standard assembly step. In some embodiments this flexibility can be applied to sockets and packages without adding any additional package costs.

In some embodiments flex cables are used as a high performance package to board interconnection. In some embodiments flex cables are used as a high performance package to package interconnection (for example, a high speed conduit between two packages on a board). In some embodiments a flex cable is coupled to a package (for example, package to board connections 122 and 132 illustrated in FIG. 1). In some embodiments a flex cable is coupled to a board (not illustrated in FIG. 1) using a board to flex cable connection (for example, using a flex cable land pad, a solder ball, and a board land pad). In some embodiments a flex cable is incorporated into a system without any new assembly processes, equipment, or connectors being necessary. In some embodiments flex cable performance is incorporated into a system without any changes to package design, power delivery, thermal, retention, and/or legacy interfaces.

In some embodiments high performance flex connections are available with an attach point between a package (or socket) and a board. In some embodiments a user is given a high level of flexibility without any additional bumping or solder processes compared to what is being used today.

Figure 2:
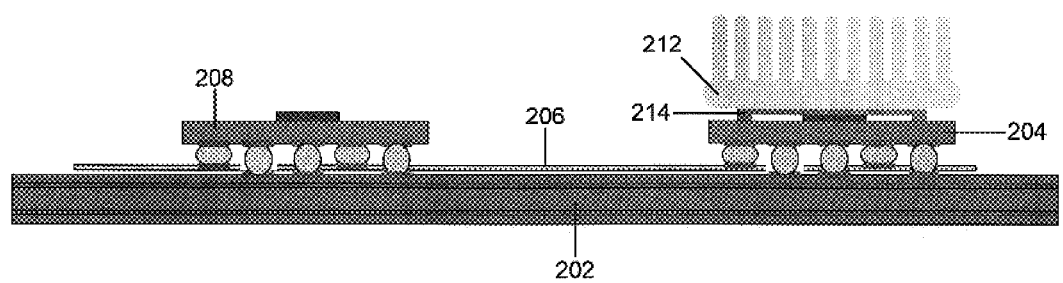
FIG. 2 illustrates a connection between two packages, a board and a flex cable according to some embodiments of the inventions.

FIG. 2 illustrates using a flex cable as a high performance package to package interconnection. FIG. 2 illustrates a board 202, a first package 204, a flex cable 206, and a second package 208. In some embodiments the first package 204 is a processor package and/or the second package 208 is a chip set package. In some embodiments a heat sink 212 and/or a heat spreader 214 are on the first package 204 to dissipate heat from the package 204.

In some embodiments as illustrated in FIG. 2 one or more package to board connections couple the packages 204 and 208 to the board 202. In some embodiments as illustrated in FIG. 2 one or more package to flex cable connections couple flex cable 206 to package 204 and/or package 208. In some embodiments as illustrate in FIG. 2 one or more package to flex cable and board connections couple the packages 204 and 208, the flex cable 206, and the board 202.

In some embodiments flex cable 206 allows high speed communication between package 204 and package 208.

In some embodiments a stress relief loop if provided in the flex cable 206 between the package 204 and the package 208.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state, or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
   a board;
   a package coupled to the board;
   a flex cable coupled to the package and extending between the board and the package, the flex cable including a non-plated through hole; and
   a package to board connection passing through the non-plated through hole, the package to board connection to pass signals directly between the board and the package.

2. The apparatus of claim 1, wherein the package to board connection includes a package land pad, a solder ball, and a board land pad.

3. The apparatus of claim 1, wherein the board is a motherboard.

4. The apparatus of claim 1, wherein the package is at least one of a processor package or a chip set package.

5. The apparatus of claim 1, further comprising a package to flex cable connection to couple the flex cable to the package, wherein the package to flex cable connection includes a plated through hole in the flex cable, a package land pad, and a solder ball.

6. The apparatus of claim 1, further comprising a board to flex cable connection to couple the board to the flex cable, wherein the board to flex cable connection includes a flex cable land pad, a solder ball, and a board land pad.

7. The apparatus of claim 1, wherein some solder balls of the package can be attached to the flex cable.

8. The apparatus of claim 1, wherein some solder balls of the package go through the flex cable and attach to the board.

9. The apparatus of claim 1, wherein some solder balls of the package go through the flex cable to mechanically anchor the flex cable to the board.

10. The apparatus of claim 1, wherein the package is an Integrated Circuit package.

11. The apparatus of claim 1, further comprising a package to flex cable connection to couple the flex cable to the package.

12. The apparatus of claim 11, wherein the package to flex cable connection includes a package land pad, a solder ball, and a flex cable land pad.

13. The apparatus of claim 1, further comprising a package to flex cable and board connection to couple the package to the flex cable and to the board.

14. The apparatus of claim 13, wherein the package to flex cable and board connection includes the plated through hole in the flex cable, a package land pad, a solder ball, and a board land pad.

15. The apparatus of claim 14, wherein the package to board connection includes a package land pad, a solder ball, and a board land pad.

16. The apparatus of claim 14, further comprising a package to flex cable connection to couple the flex cable to the package, wherein the package to flex cable connection includes a package land pad, a solder ball, and a flex cable land pad. to board connection includes a package land pad, a solder ball, and a board land pad.

17. The apparatus of claim 16, further comprising a package to board connection to couple the package to the board, wherein the package to board connection includes a package land pad, a solder ball, and a board land pad.

18. An apparatus comprising:
   a board;
   a first package coupled to the board;
   a second package coupled to the board; and
   a flex cable coupled to the first package and coupled to the second package and extending between the board and the first and second packages to provide high speed communication between the first package and the second package, the flex cable including a non-plated through hole; and
   a package to board connection passing through the non-plated through hole, the package to board connection to pass signals directly between the board and at least one of the packages.

19. The apparatus of claim 18, wherein some solder balls of at least one of the packages can be attached to the flex cable.

20. The apparatus of claim 18, wherein some solder balls of at least one of the packages go through the flex cable and attach to the board.

21. The apparatus of claim 18, wherein some solder balls of at least one of the packages go through the flex cable to mechanically anchor the flex cable to the board.

22. The apparatus of claim 18, wherein the first package is a processor package and the second package is a chip set package.

23. The apparatus of claim 18, wherein the first package is an Integrated Circuit package.

24. The apparatus of claim 18, wherein the first package is an Integrated Circuit package and the second package is an Integrated Circuit package.

* * * * *